(12) United States Patent
Shibayama

(10) Patent No.: US 7,420,257 B2
(45) Date of Patent: Sep. 2, 2008

(54) BACKSIDE-ILLUMINATED PHOTODETECTOR

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/565,282

(22) PCT Filed: Jul. 22, 2004

(86) PCT No.: PCT/JP2004/010410

§ 371 (c)(1),
(2), (4) Date: Aug. 14, 2006

(87) PCT Pub. No.: WO2005/008788

PCT Pub. Date: Jan. 27, 2005

(65) Prior Publication Data

US 2007/0007556 A1   Jan. 11, 2007

(30) Foreign Application Priority Data

Jul. 23, 2003  (JP) ............................. 2003-278567

(51) Int. Cl.
*H01L 31/00* (2006.01)
(52) U.S. Cl. ................ 257/460; 257/433; 257/434; 257/447; 257/E31.117; 257/E31.119
(58) Field of Classification Search ................ 257/433, 257/434, 447, 460, E31.117, E31.119, E23.128
See application file for complete search history.

(56) References Cited

U.S. PATENT DOCUMENTS 4,001,863 A * 1/1977 Kobayashi et al. .......... 257/702

4,857,980 A    8/1989  Hoeberechts

FOREIGN PATENT DOCUMENTS

| CN | 1043407 | 6/1990 |
|---|---|---|
| CN | 1244949 | 2/2000 |
| DE | 41 02 285 | 8/1992 |
| EP | 0 444 370 | 9/1991 |
| EP | 0 697 743 | 2/1996 |

(Continued)

*Primary Examiner*—Matthew E Warren
(74) *Attorney, Agent, or Firm*—Drinker Biddle & Reath LLP

(57) ABSTRACT

The present invention provides a back illuminated photodetector having a sufficiently small package as well as being capable of suppressing the scattering of to-be-detected light. A back illuminated photodiode 1 comprises an N-type semiconductor substrate 10, a P+-type doped semiconductor region 11, a recessed portion 12, and a coating layer 13. In the surface layer on the upper surface S1 side of the N-type semiconductor substrate 10 is formed the P+-type doped semiconductor region 11. In the rear surface S2 of the N-type semiconductor substrate 10 and in an area opposite the P+-type doped semiconductor region 11 is formed the recessed portion 12 that functions as an incident part for to-be-detected light. Also, on the rear surface S2 is provided the coating layer 13 for transmitting to-be-detected light that is made incident into the recessed portion 12. The coating layer 13 is here arranged in such a manner that the portion provided on the recessed portion 12 is sunk lower than the portion provided on the outer edge portion 14 of the recessed portion 12.

9 Claims, 24 Drawing Sheets

FOREIGN PATENT DOCUMENTS

| | | |
|---|---|---|
| EP | 1 548 836 | 6/2005 |
| JP | 02-185070 | 7/1990 |
| JP | 09-219421 | 8/1997 |
| JP | 2000-299489 | 10/2000 |
| JP | 2002-319669 | 10/2002 |
| WO | 96/36999 | 11/1996 |
| WO | 97/23897 | 7/1997 |

* cited by examiner

PRIOR ART

BACKSIDE-ILLUMINATED PHOTODETECTOR

TECHNICAL FIELD

The present invention relates to a back illuminated photodetector.

BACKGROUND ART

In such a conventional back illuminated photodiode 100 as shown in FIG. 24, in the superficial surface layer of an N-type silicon substrate 101 are formed a $P^+$-type highly-doped semiconductor region 102 and an $N^+$-type highly-doped semiconductor region 103. The $P^+$-type highly-doped semiconductor region 102 and the $N^+$-type highly-doped semiconductor region 103 are connected, respectively, with an anode electrode 104 and a cathode electrode 105. On the electrodes 104 and 105 are formed bump electrodes 106 made from solder. Also, the N-type silicon substrate 101 is thinned in the portion corresponding to the $P^+$-type highly-doped semiconductor region 102 from the rear surface side thereof. The thinned portion functions as an incident part for to-be-detected light.

As shown in FIG. 24, the back illuminated photodiode 100 is packed into a ceramic package 107 by flip-chip bonding. That is, the bump electrodes 106 of the back illuminated photodiode 100 are connected to solder pads 109 provided on a bottom wiring 108 of the ceramic package 107. The bottom wiring 108 is connected to output terminal pins 110 through wire bonding. Also, on the surface of the ceramic package 107 is seam-welded a window frame 111 using brazing material 112. In the window frame 111 is formed an opening at the position corresponding to the thinned portion of the back illuminated photodiode 100, and in the opening is provided a transmissive window member 113 such as kovar glass for transmitting to-be-detected light.

Patent Document 1: Japanese Published Unexamined Patent Application No. H09-219421

DISCLOSURE OF THE INVENTION

Problems to be Solved by the Invention

However, in such an arrangement of using a ceramic package in a back illuminated photodiode as above, there is a problem in that the package becomes larger.

Meanwhile, in Patent Document 1 is disclosed a CSP (Chip Size Package) technique for semiconductor electronic components. This technique is adapted to seal the both surfaces of a wafer with semiconductor electronic components built therein using organic material such as resin, and then to form an opening in the organic material provided on one surface side of the wafer by photolithography to form electrodes therein.

However, trying to apply such a CSP technique to a back illuminated photodiode to reduce the package size leads to the following problem. That is, the back illuminated photodiode is thinned at the portion that functions as an incident part for to-be-detected light, which reduces the mechanical strength thereof. Therefore, not a pyramid collet but a flat collet is used when assembling the back illuminated photodiode. For example, when heating and pressurizing a bump electrode, etc., provided on the surface side of a photodiode, heat and pressure is added from a heater block while the back illuminated photodiode sticks thereto using a flat collet to employ the rear surface thereof as a sticking surface.

In the case of using a flat collet for a back illuminated photodiode with the rear surface being sealed with resin, the resin may be damaged due to contact with the collet. If the resin in the thinned portion (i.e. incident part for to-be-detected light) of the back illuminated photodiode may thus be damaged, there is a problem in that the damage scatters to-be-detected light. Then, the scattering of to-be-detected light also leads to a reduction in the sensitivity of the back illuminated photodiode.

The present invention has been made to solve the above-described problems, and an object thereof is to provide a back illuminated photodetector having a sufficiently small package as well as being capable of suppressing the scattering of to-be-detected light.

Means for Solving the Problems

In order to solve the above-described problem, the present invention is directed to a back illuminated photodetector comprising: a first conductive type semiconductor substrate; a second conductive type doped semiconductor region provided in the first superficial surface layer of the semiconductor substrate; a recessed portion for incidence of to-be-detected light formed in the second surface of the semiconductor substrate and in an area opposite the doped semiconductor region; and a coating layer made of resin for transmitting the to-be-detected light, the coating layer being provided on the second surface, and the coating layer being arranged in such a manner that the portion provided on the recessed portion in the second surface is sunk lower than the portion provided on the outer edge portion of the recessed portion.

In the back illuminated photodetector, since there is provided the coating layer, the mechanical strength of the back illuminated photodetector can be increased. The increase in mechanical strength allows for dicing at a wafer level, whereby it is possible to obtain a chip-sized back illuminated photodetector. Accordingly, it is possible to achieve a back illuminated photodetector having a sufficiently small package. The coating layer is also made of resin for transmitting to-be-detected light not only to increase the mechanical strength of the back illuminated photodetector, but also to function as a transmissive window member for to-be-detected light.

Further, the coating layer is arranged in such a manner that the portion provided on the recessed portion is sunk lower than the portion provided on the outer edge portion of the recessed portion. Therefore, even if a flat collet may be used in an assembling operation, the surface of the coating layer provided on the recessed portion is not brought into contact with the flat collet. Thus, the incident part for to-be-detected light within the surface of the coating layer cannot be damaged, whereby it is possible to suppress the scattering of to-be-detected light.

The back illuminated photodetector according to the present invention preferably comprises a supporting film provided on the first surface of the semiconductor substrate to support the semiconductor substrate. In this case, the mechanical strength of the back illuminated photodetector can be increased.

Further, the back illuminated photodetector preferably comprises a filling electrode penetrating through the supporting film and connected electrically to the doped layer at one end thereof. In this case, it is possible to take a detected signal easily outside the back illuminated photodetector.

It is preferable that a highly-doped semiconductor region with impurities of the first conductive type added thereto at a high concentration is exposed across the entire side surface of the semiconductor substrate. In this case, even if a side surface of the semiconductor substrate may be damaged through dicing, etc., the highly-doped semiconductor region can trap unnecessary carriers that are generated in the vicinity of the side surface of the semiconductor substrate, and therefore can suppress dark current and/or noise.

It is preferred that a highly-doped semiconductor layer with impurities of the first conductive type added thereto at a high concentration is provided in the bottom portion of the recessed portion within the second superficial surface layer of the semiconductor substrate. The highly-doped semiconductor layer functions as an accumulation layer. This can make carriers generated upon incidence of to-be-detected light easy to move toward the first surface of the semiconductor substrate, resulting in an increase in the sensitivity of the back illuminated photodetector.

It is preferable that a highly-doped semiconductor layer with impurities of the first conductive type added thereto at a high concentration is provided in the second superficial surface layer in the outer edge portion of the semiconductor substrate. In this case, even if there may be crystal defects in the vicinity of the second superficial surface in the outer edge portion, the highly-doped semiconductor layer can suppress dark current and/or noise due to the crystal defects.

Effects of the Invention

In accordance with the present invention, it is possible to achieve a back illuminated photodetector having a sufficiently small package as well as being capable of suppressing the scattering of to-be-detected light.

Figure 1:
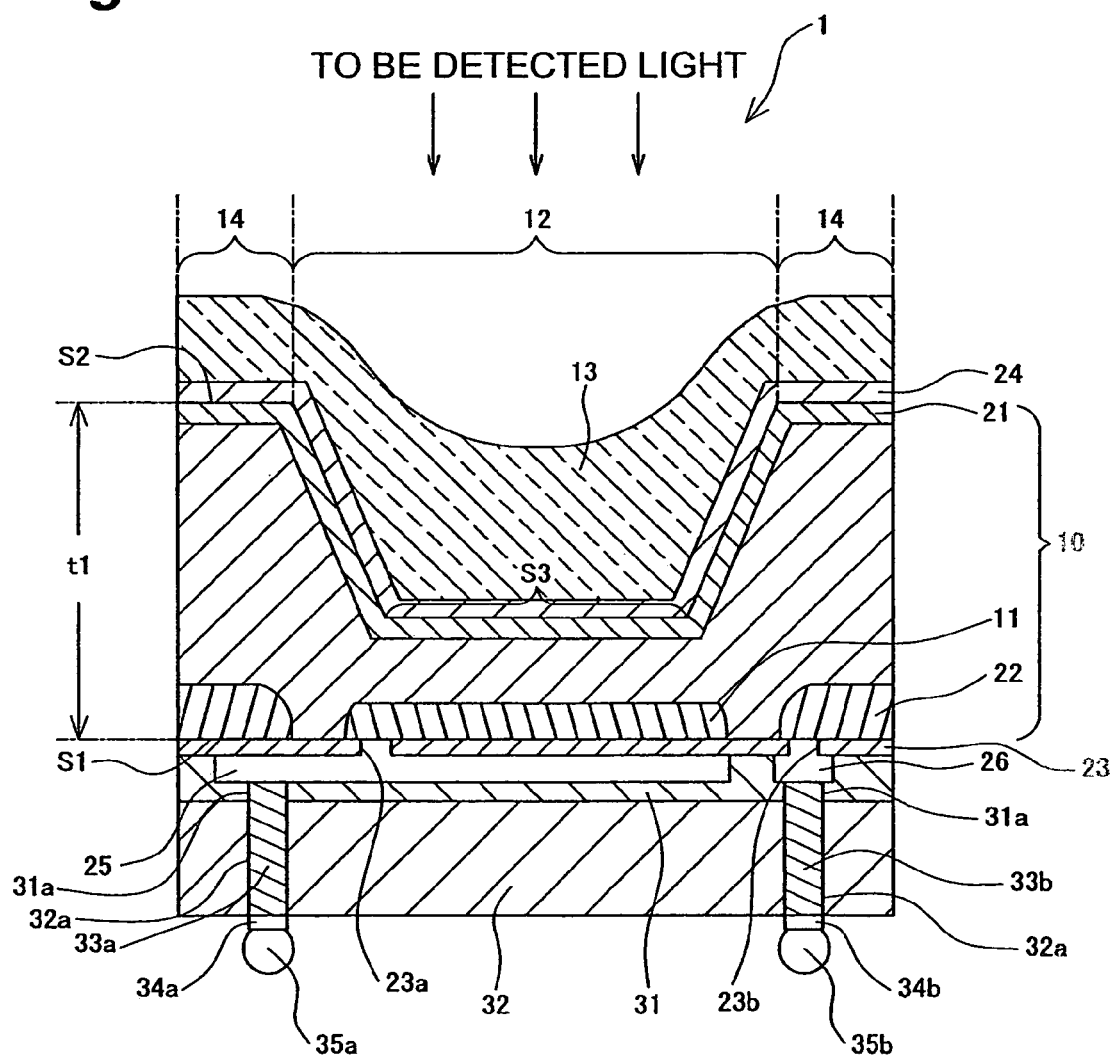
FIG. 1 is a cross-sectional view showing a first embodiment of a back illuminated photodetector according to the present invention.

DESCRIPTION OF SYMBOLS 1 and 2: Back illuminated photodiodes, 3: Back illuminated photodiode array, 10 and 50: N-type semiconductor substrates, 11 and 51: P$^+$-type doped semiconductor regions, 12 and 52: Recessed portions, 13 and 53: Coating layers, 14 and 54: Outer edge portions, 20: Semiconductor substrate, 21 and 61: N$^+$-type highly-doped semiconductor layers, 22; 28 and 62: N$^+$-type highly-doped semiconductor regions, 23; 24; 63 and 64: Insulating films, 25 and 65: Anode electrodes, 26 and 66: Cathode electrodes, 31 and 71: Passivation films, 32 and 72: Supporting films, 33$a$; 33$b$; 73$a$ and 73$b$: Filling electrodes, 34$a$; 34$b$; 74$a$ and 74$b$: UBMs, 35$a$; 35$b$; 75$a$ and 75$b$: Bumps, S1: Upper surface, S2: Rear surface, S3: Bottom surface of recessed portion, S4: Side surface of the semiconductor substrate 20

BEST MODES FOR CARRYING OUT THE INVENTION

Preferred embodiments of a back illuminated photodetector according to the present invention will hereinafter be described in detail with reference to the accompanying drawings. Additionally, in the descriptions of the drawings, identical components are designated by the same reference numerals to omit overlapped description. Also, the dimensional ratios in the drawings do not necessarily correspond to those in the descriptions.

FIG. 1 is a cross-sectional view showing a first embodiment of a back illuminated photodetector according to the present invention. The back illuminated photodiode 1 is adapted to receive to-be-detected light from the rear surface thereof, to generate carriers upon incidence of the to-be-detected light, and then to output the generated carriers as a detected signal from the upper surface thereof. The back illuminated photodiode 1 comprises an N-type semiconductor substrate 10, a P$^+$-type doped semiconductor region 11, a recessed portion 12, and a coating layer 13. As the N-type semiconductor substrate 10, for example, a silicon substrate with N-type impurities such as phosphorous added thereto can be used. The impurity concentration of the N-type semiconductor substrate 10 is $10^{12}$ to $10^{15}$/cm$^3$, for example. Also, the thickness t1 of the N-type semiconductor substrate 10 is 200 μm to 500 μm, for example.

In the surface layer on the upper surface (first surface) S1 side of the N-type semiconductor substrate 10 is partially formed the P$^+$-type doped semiconductor region 11. The P$^+$-type doped semiconductor region 11 is provided with P-type impurities such as boron to form a PN junction with the N-type semiconductor substrate 10. The impurity concentration of the P$^+$-type doped semiconductor region 11 is $10^{15}$ to $10^{20}$/cm$^3$, for example. Also, the depth of the P$^+$-type doped semiconductor region 11 is 0.1 μm to 20 μm, for example.

In the rear surface (second surface) S2 of the N-type semiconductor substrate 10 and in an area opposite the P$^+$-type doped semiconductor region 11 is formed the recessed portion 12. The recessed portion 12 functions as an incident part for to-be-detected light. The recessed portion 12 has a shape that narrows gradually from the rear surface S2 to the upper surface S1. More specifically, the recessed portion 12 may have, for example, a square pyramid shape or a tapered shape that narrows gradually from the rear surface S2 to the upper surface S1. The depth of the recessed portion 12 is 2 μm to 400 μm, for example. Also, due to the thus formed recessed portion 12, the area between the bottom surface S3 of the recessed portion and the P$^+$-type doped semiconductor region 11 within the N-type semiconductor substrate 10 is made thinner than the other areas so that carriers generated upon incidence of to-be-detected light via the rear surface S2 can easily reach near the P$^+$-type doped semiconductor region 11 provided in the surface layer on the upper surface S1 side. In addition, the thickness of the thinned area is 10 μm to 200 μm, for example.

On the rear surface S2 of the N-type semiconductor substrate 10 is provided the coating layer 13. The coating layer 13 is made of resin transparent to to-be-detected light, that is, having a sufficient transmissivity for the wavelength of to-be-detected light. As such resin epoxy-based, silicon-based, acryl-based or polyimide-based one, or composite material thereof can be cited. The coating layer 13 functions as a protective layer for protecting the rear surface S2 as well as a transmissive window member for transmitting to-be-detected light that is made incident into the recessed portion 12. Also, the coating layer 13 is arranged in such a manner that the portion provided on the recessed portion 12 is sunk lower than the portion provided on the outer edge portion 14 of the recessed portion 12. That is, the surface of the coating layer 13 provided in the portion where the recessed portion 12 is formed gets into the N-type semiconductor substrate 10 side deeper than the surface of the coating layer 13 provided in the outer edge portion 14 of the recessed portion 12. Herein, the outer edge portion 14 indicates the portion laterally surrounding the recessed portion 12 within the N-type semiconductor substrate 10. The thickness of the coating layer 13 on the outer edge portion 14 is 5 μm to 500 μm, for example, and preferably 250 μm.

The back illuminated photodiode 1 also comprises an N$^+$-type highly-doped semiconductor layer 21, an N$^+$-type highly-doped semiconductor region 22, insulating films 23 and 24, an anode electrode 25, and a cathode electrode 26. The N$^+$-type highly-doped semiconductor layer 21 is formed in the entire surface layer on the rear surface S2 side of the N-type semiconductor substrate 10. The N$^+$-type highly-doped semiconductor layer 21 is provided with N-type impurities at a concentration higher than in the N-type semiconductor substrate 10. The impurity concentration of the N$^+$-type highly-doped semiconductor layer 21 is $10^{15}$ to $10^{20}$/cm$^3$, for example. Also, the depth of the N$^+$-type highly-doped semiconductor layer 21 is 0.1 μm to 20 μm, for example.

The N$^+$-type highly-doped semiconductor region 22 is formed in the surface layer on the upper surface S1 side of the N-type semiconductor substrate 10 at a predetermined distance from the P$^+$-type doped semiconductor region 11. The N$^+$-type highly-doped semiconductor region 22 is also provided with N-type impurities at a high concentration, as is the case with the N$^+$-type highly-doped semiconductor layer 21, to be a contact layer for the cathode electrode 26 to be described hereinafter as well as to have a function of suppressing surface leakage current in the upper surface S1. The impurity concentration of the N$^+$-type highly-doped semiconductor region 22 is $10^{15}$ to $10^{20}$/cm$^3$, for example. Also, the depth of the N$^+$-type highly-doped semiconductor region 22 is 0.1 μm to 30 μm, for example.

The insulating films 23 and 24 are formed, respectively, on the upper surface S1 and the rear surface S2 of the N-type semiconductor substrate 10. The insulating films 23 and 24 are made of SiO$_2$, for example. The thickness of the insulating film 23 is 0.1 μm to 2 μm, for example. Meanwhile, the thickness of the insulating film 24 is 0.05 μm to 1 μm, for example. Also, in the insulating film 23 are formed openings (contact holes) 23a and 23b, one opening 23a being provided within the range of the P$^+$-type doped semiconductor region 11, while the other opening 23b being provided within the range of the N$^+$-type highly-doped semiconductor region 22.

On the insulating film 23 and in the areas including the openings 23a and 23b are formed, respectively, the anode electrode 25 and the cathode electrode 26. The thickness of the electrodes 25 and 26 is 1 μm, for example. The electrodes 25 and 26 are provided in such a manner as to fill the respective openings 23a and 23b. Thus, the anode electrode 25 is connected directly to the P$^+$-type doped semiconductor region 11 through the opening 23a, while the cathode electrode 26 is connected directly to the N$^+$-type highly-doped semiconductor region 22 through the opening 23b. As the anode and cathode electrodes 25 and 26, for example, A1, can be used.

The back illuminated photodiode 1 further comprises a passivation film 31, a supporting film 32, filling electrodes 33a and 33b, UBMs (Under Bump Metals) 34a and 34b, and bumps 35a and 35b. The passivation film 31 is provided on the upper surface S1 of the N-type semiconductor substrate 10 in such a manner as to cover the insulating film 23, anode electrode 25, and cathode electrode 26. Also, in the portions provided on the anode electrode 25 and the cathode electrode 26 within the passivation film 31 are formed through holes 31a to be filled with the filling electrodes 33a and 33b to be described hereinafter. The passivation film 31 is made of SiN, for example, to protect the upper surface S1 of the N-type semiconductor substrate 10. The passivation film 31 can be formed by, for example, a plasma-CVD method. Also, the thickness of the passivation film 31 is 1 μm, for example.

On the passivation film 31 is formed the supporting film 32. The supporting film 32 is adapted to support the N-type semiconductor substrate 10. Also, in the portions corresponding to the through holes 31a in the passivation film 31 within the supporting film 32 are formed through holes 32a to be filled with the filling electrodes 33a and 33b that also fill the through holes 31a. As a material of the supporting film 32, for example, resin or SiO$_2$, etc., that can be formed by, for example, a plasma-CVD method can be used. Also, the thickness of the supporting film 32 is 2 μm to 100 μm, for example, and preferably about 50 μm.

The filling electrodes 33a and 33b fill the through holes 31a and 32a, and are brought into contact, respectively, with the anode electrode 25 and the cathode electrode 26 at one end thereof to be connected electrically to the P⁺-type doped semiconductor region 11 and the N⁺-type highly-doped semiconductor region 22. Also, the other end of the filling electrodes 33a and 33b is exposed at the surface of the supporting film 32. That is, the filling electrodes 33a and 33b penetrate through the passivation film 31 and the supporting film 32 to extend, respectively, from the anode electrode 25 and the cathode electrode 26 to the surface of the supporting film 32. In addition, the filling electrodes 33a and 33b each have an approximately cylindrical shape. The filling electrodes 33a and 33b are adapted to connect, respectively, the electrodes 25 and 26 and the bumps 35a and 35b to be described hereinafter electrically with each other. The filling electrodes 33a and 33b are made of Cu, for example. Also, the diameter of the through holes 31a and 32a is 10 μm to 200 μm, for example, and preferably about 100 μm.

On the exposed portions of the filling electrodes 33a and 33b at the surface of the supporting film 32 are formed the UBMs 34a and 34b. The UBMs 34a and 34b are composed of accumulation films made of Ni and Au, for example. Also, the thickness of the UBMs 34a and 34b is 0.1 μm to 5 μm, for example.

On the surfaces of the UBMs 34a and 34b on the opposite side of the filling electrodes 33a and 33b are formed the bumps 35a and 35b. The bumps 35a and 35b are therefore connected, respectively, to the anode electrode 25 and the cathode electrode 26 electrically. The bumps 35a and 35b each have an approximately spherical shape except for the surfaces in contact with the UBMs 34a and 34b. As the bumps 35a and 35b, for example, solder, gold, Ni—Au, Cu, or resin containing metal filler can be used.

The operation of the back illuminated photodiode 1 will here be described. It is assumed here that the back illuminated photodiode 1 is applied with a reverse bias voltage, and that there is generated a depletion layer in the thinned area in the N-type semiconductor substrate 10. When to-be-detected light penetrates through the coating layer 13 and then enters the N-type semiconductor substrate 10 from the recessed portion 12, the light is absorbed mainly in the thinned area. Accordingly, in the area, carriers (holes and electrons) are generated. The generated holes and electrons are moved, respectively, to the P⁺-type doped semiconductor region 11 and the N⁺-type highly-doped semiconductor region 22 in accordance with the reverse bias electric field. Holes and electrons that have reached the P⁺-type doped semiconductor region 11 and the N⁺-type highly-doped semiconductor region 22 are moved to the bumps 35a and 35b from the filling electrodes 33a and 33b and the UBMs 34a and 34b to be output as a detected signal from the bumps 35a and 35b.

The effect of the back illuminated photodiode 1 will here be described. In the back illuminated photodiode 1, since there is provided the coating layer 13, the mechanical strength of the back illuminated photodiode 1 is increased. In particular, since the coating layer 13 is provided on the recessed portion 12, it is possible to prevent the thinned area in the N-type semiconductor substrate 10 from being distorted, flexed or damaged even if pressure and/or heat may be applied to the back illuminated photodiode 1 in an assembling operation. Also, the increase in mechanical strength allows for dicing at a wafer level, whereby it is possible to obtain a chip-sized back illuminated photodiode 1. Accordingly, there is achieved a back illuminated photodiode 1 having a sufficiently small package. In addition, since there is no need for a ceramic package, etc., it is possible to reduce the cost of manufacturing a back illuminated photodiode 1. There is thus achieved an inexpensive and highly reliable as well as a small back illuminated photodiode 1.

Figure 2:
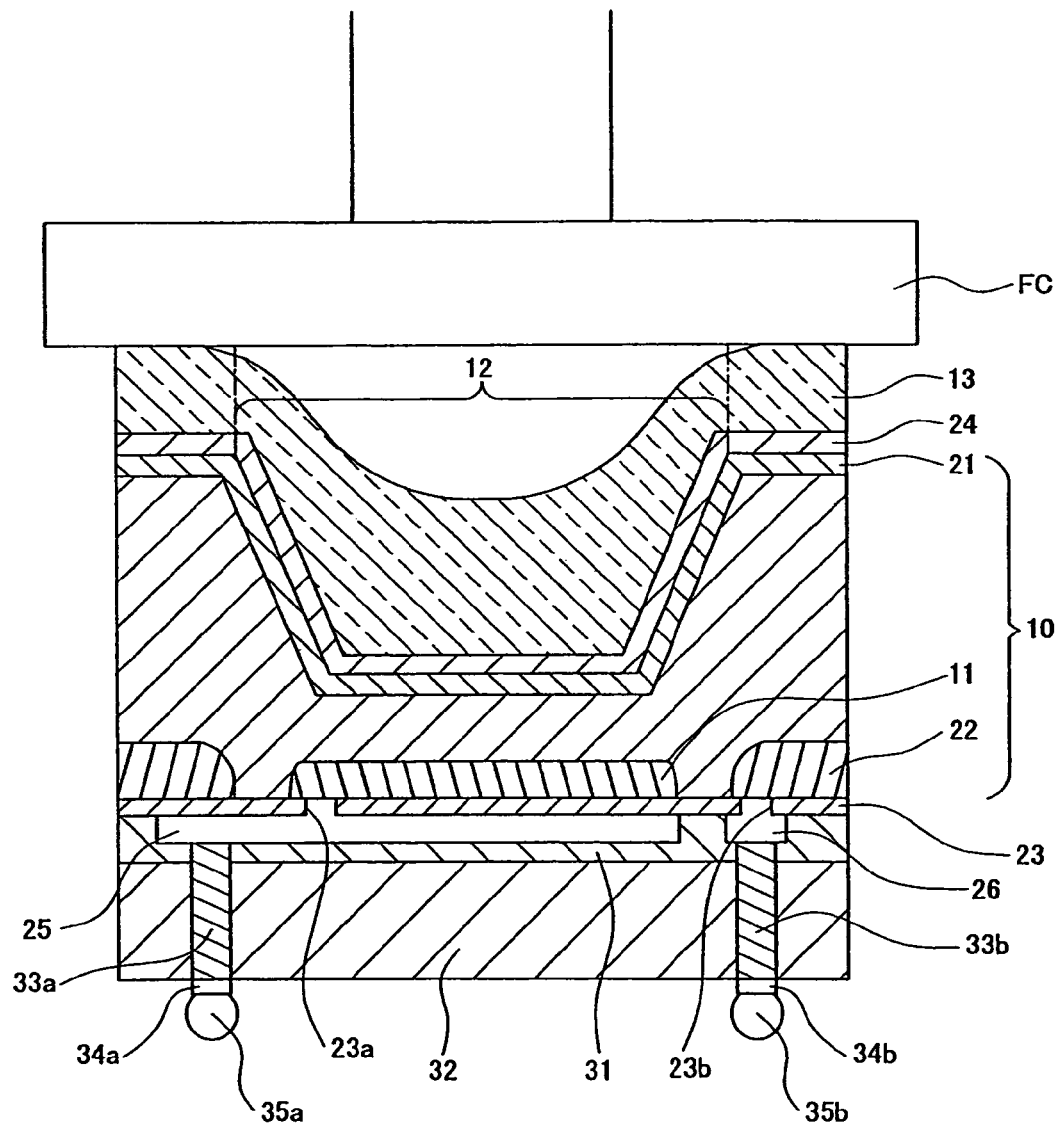
FIG. 2 is a view illustrating the effect of the back illuminated photodiode 1 shown in FIG. 1.

Further, the coating layer 13 is arranged in such a manner that the portion provided on the recessed portion 12 is sunk lower than the portion provided on the outer edge portion 14 of the recessed portion 12. Therefore, even if a flat collet FC may be used in an assembling operation as shown in FIG. 2, the surface of the coating layer 13 provided on the recessed portion 12 is not brought into contact with the flat collet FC. Thus, the incident part for to-be-detected light within the surface of the coating layer 13 cannot be damaged, whereby it is possible to suppress the scattering of to-be-detected light. Thus, a highly sensitive back illuminated photodiode 1 is achieved.

In addition, providing the coating layer 13 also on the outer edge portion 14 prevents the flat collet FC from being brought into direct contact with the outer edge portion 14. It is thus possible to prevent the generation of crystal defects in the outer edge portion 14 due to contact with the flat collet FC, and therefore to suppress dark current and/or noise due to the crystal defects.

Also, as the coating layer 13 resin is used, which makes it easy to form the coating layer 13 into a desired shape.

The provided supporting film 32 further increases the mechanical strength of the back illuminated photodiode 1.

The provided filling electrodes 33a and 33b make it easy to take a detected signal outside from the electrodes 25 and 26. Additionally, the filling electrodes 33a and 33b may be formed on the sidewalls of the through holes 31a and 32a to be connected electrically to the anode electrode 25 and the cathode electrode 26.

The N⁺-type highly-doped semiconductor layer 21 is formed in the entire surface layer on the rear surface S2 side of the N-type semiconductor substrate 10. The N⁺-type highly-doped semiconductor layer 21 provided in the bottom surface S3 of the recessed portion 12 within the surface layer of the rear surface S2 functions as an accumulation layer. This can prevent carriers generated in the N-type semiconductor substrate 10 from being recombined in the vicinity of the bottom surface S3. Thus, a more highly sensitive back illuminated photodiode 1 is achieved. Here, the impurity concentration of the N⁺-type highly-doped semiconductor layer 21 is preferably $10^{15}/cm^3$ or more. In this case, the N⁺-type highly-doped semiconductor layer 21 can suitably function as an accumulation layer.

Also, even if there may be crystal defects in the outer edge portion 14, the N⁺-type highly-doped semiconductor layer 21, which is provided in the surface layer on the rear surface S2 side within the outer edge portion 14 of the N-type semiconductor substrate 10, can suppress dark current and/or noise due to the crystal defects. Therefore, in accordance with the back illuminated photodiode 1, it is possible to obtain a detected signal at a high S/N ratio. Also, here, the impurity concentration of the N⁺-type highly-doped semiconductor layer 21 is preferably $10^{15}/cm^3$ or more. In this case, the N⁺-type highly-doped semiconductor layer 21 can suppress dark current and/or noise due to crystal defects sufficiently.

Figure 3:
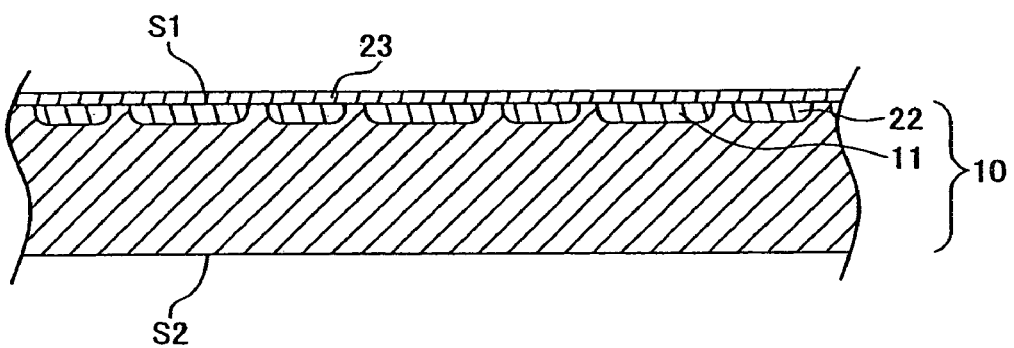
FIG. 3 is a step chart showing a method for manufacturing the back illuminated photodiode 1 shown in FIG. 1.

An exemplary method for manufacturing the back illuminated photodiode 1 shown in FIG. 1 will here be described with reference to FIG. 3 to FIG. 17. First, there is prepared an N-type semiconductor substrate 10 made of an N-type silicon wafer with the upper surface S1 and the rear surface S2 thereof being formed into (100) planes. The N-type semiconductor substrate 10 is thermally oxidized to form an insulating film made of SiO₂ on the upper surface S1 of the N-type semiconductor substrate 10. Also, in predetermined portions of the insulating film are formed openings, and then phosphorous is doped into the N-type semiconductor substrate 10 from the openings to form N+-type highly-doped semiconductor regions 22. Subsequently, the N-type semiconductor substrate 10 is oxidized to form an insulating film on the upper surface S1. Similarly, in predetermined portions of the insulating film are formed openings, and then boron is doped into the N-type semiconductor substrate 10 from the openings to form P+-type doped semiconductor regions 11. Subsequently, the N-type semiconductor substrate 10 is oxidized to form an insulating film 23 on the upper surface S1 (FIG. 3).

Figure 4:
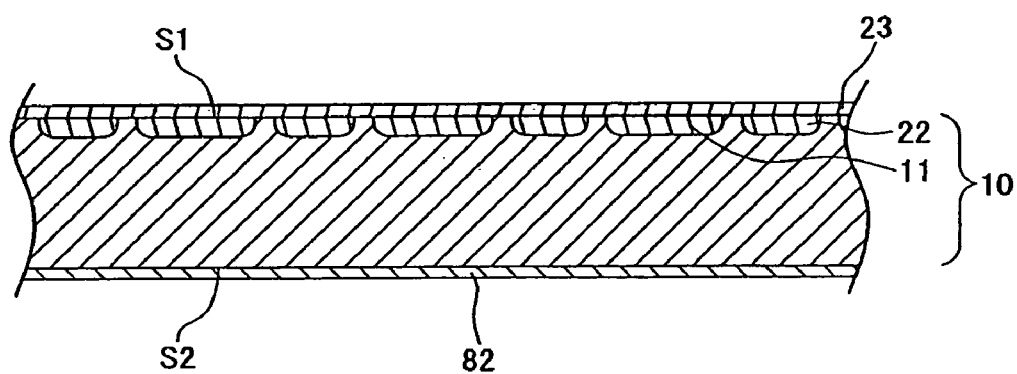
FIG. 4 is a step chart showing a method for manufacturing the back illuminated photodiode 1 shown in FIG. 1.
Figure 5:
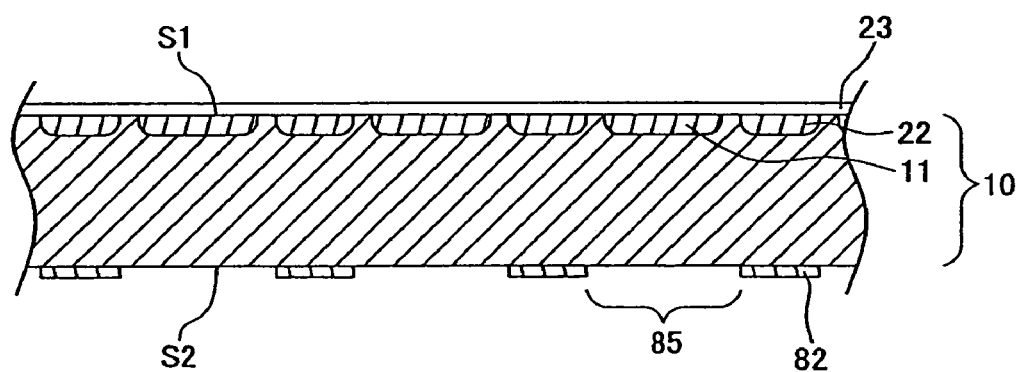
FIG. 5 is a step chart showing a method for manufacturing the back illuminated photodiode 1 shown in FIG. 1.
Figure 6:
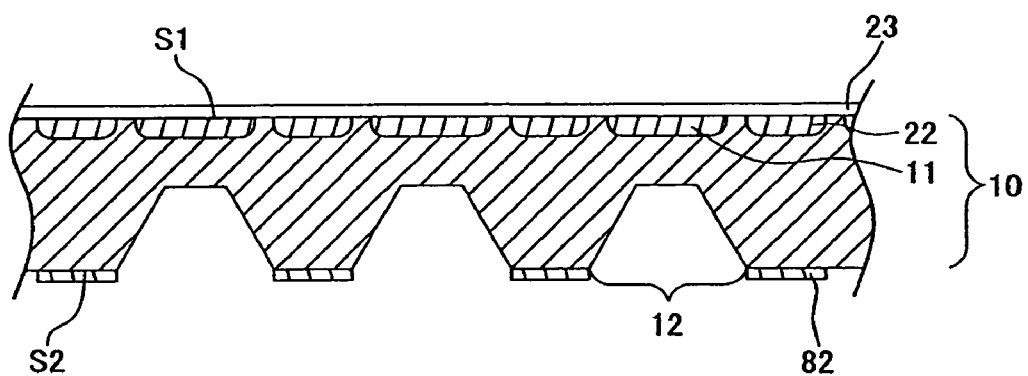
FIG. 6 is a step chart showing a method for manufacturing the back illuminated photodiode 1 shown in FIG. 1.

Next, the rear surface S2 of the N-type semiconductor substrate 10 is polished, and SiN 82 is deposited on the rear surface S2 of the N-type semiconductor substrate 10 by LP-CVD (FIG. 4). Also, in the SiN 82 on the rear surface S2 are formed openings 85 to form recessed portions 12 (FIG. 5). Then, an etching operation is performed using KOH, etc., through the openings 85 to form recessed portions 12 (FIG. 6).

Figure 7:
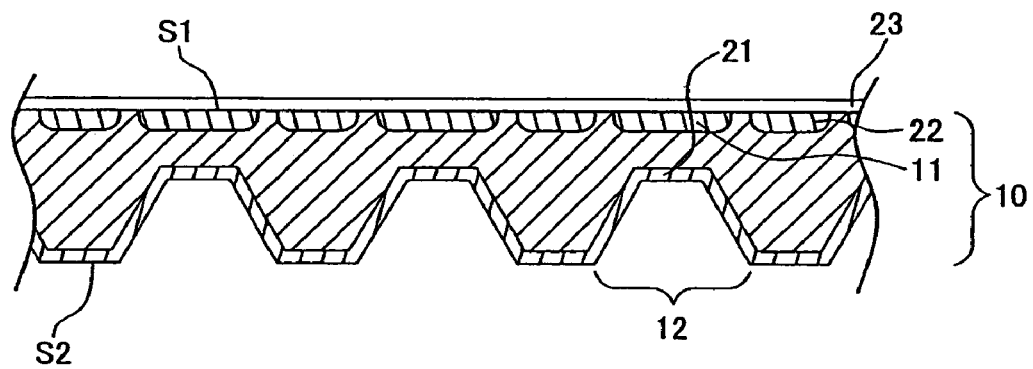
FIG. 7 is a step chart showing a method for manufacturing the back illuminated photodiode 1 shown in FIG. 1.
Figure 8:
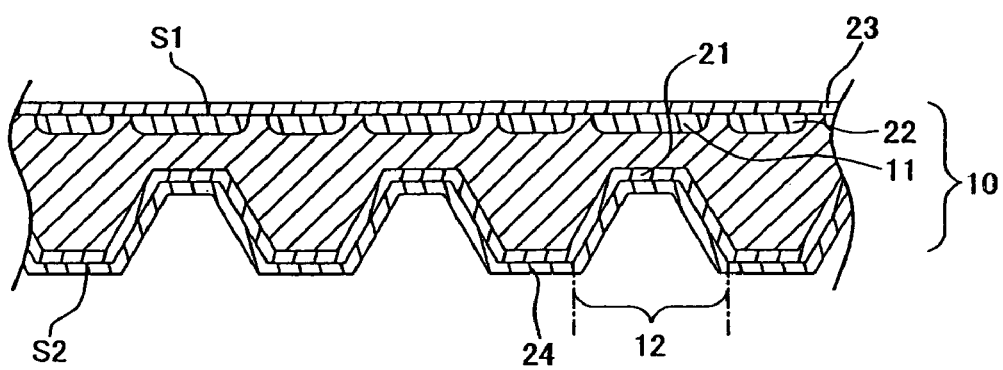
FIG. 8 is a step chart showing a method for manufacturing the back illuminated photodiode 1 shown in FIG. 1.
Figure 9:
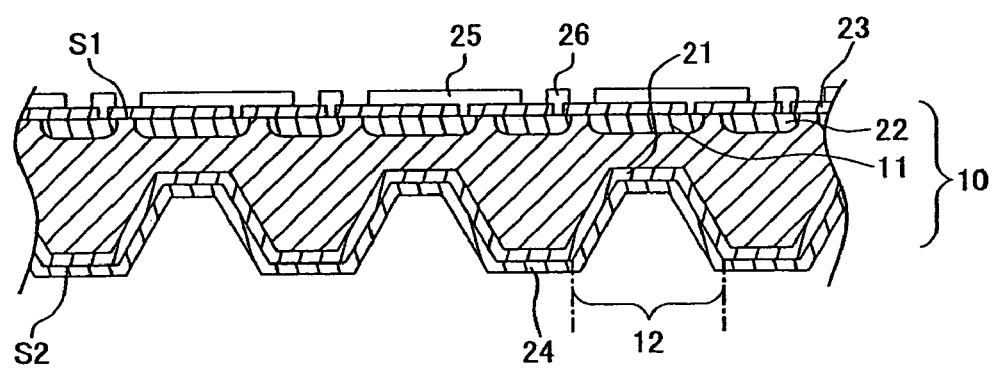
FIG. 9 is a step chart showing a method for manufacturing the back illuminated photodiode 1 shown in FIG. 1.

Next, after the SiN 82 is removed, ion implantation, etc., is performed onto the rear surface S2 side of the N-type semiconductor substrate 10 with the recessed portions 12 formed therein to dope N-type impurities and thereby to form an N+-type highly-doped semiconductor layer 21 in the entire surface layer on the rear surface S2 side (FIG. 7). Then, the substrate is thermally oxidized to form an insulating film 24 in the entire surface layer on the rear surface S2 side (FIG. 8). Contact holes for electrodes are formed in the insulating film 23 on the upper surface S1, and after aluminum is deposited on the upper surface S1, a predetermined pattern is made to form anode electrodes 25 and cathode electrodes 26 (FIG. 9).

Figure 10:
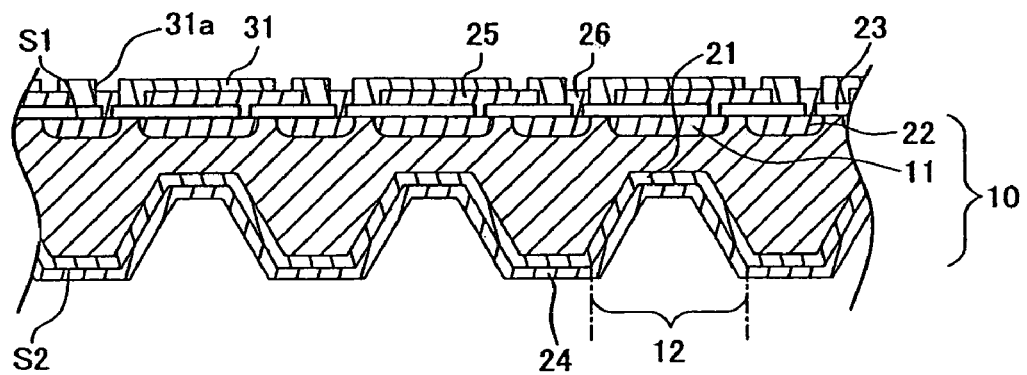
FIG. 10 is a step chart showing a method for manufacturing the back illuminated photodiode 1 shown in FIG. 1.
Figure 11:
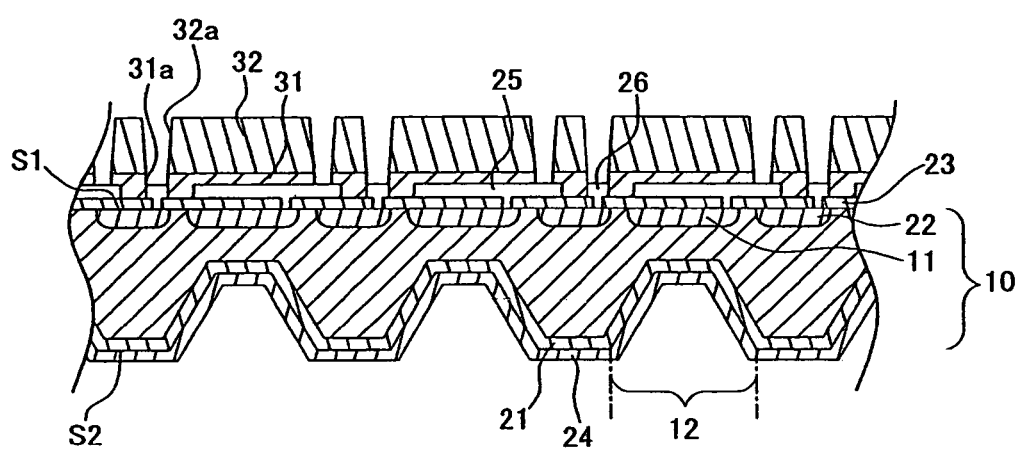
FIG. 11 is a step chart showing a method for manufacturing the back illuminated photodiode 1 shown in FIG. 1.
Figure 12:
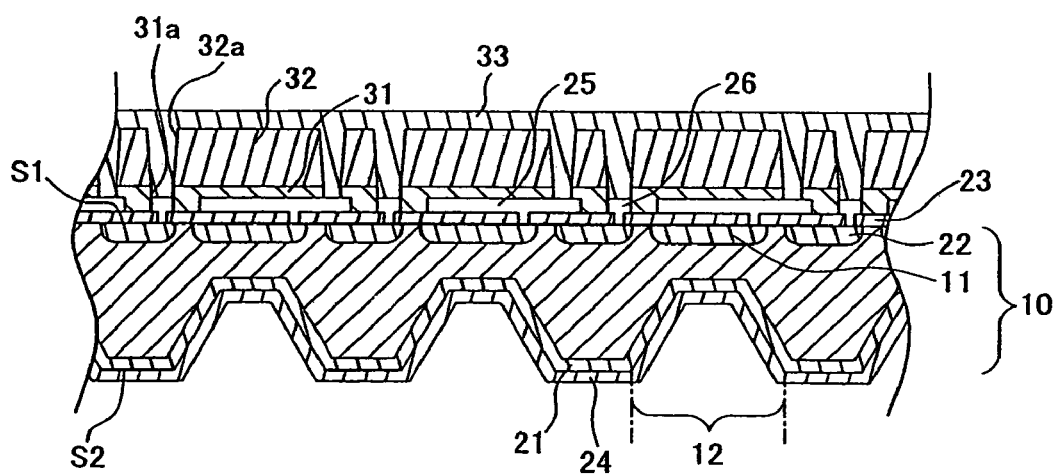
FIG. 12 is a step chart showing a method for manufacturing the back illuminated photodiode 1 shown in FIG. 1.

Next, a passivation film 31 made of SiN is deposited on the upper surface S1 of the N-type semiconductor substrate 10, on which the anode electrodes 25 and the cathode electrodes 26 are formed, by a plasma-CVD method. Also, openings 31a are formed in portions corresponding to bumps 35a and 35b within the passivation film 31 (FIG. 10). Further, a thick supporting film 32 made of resin is formed on the upper surface S1, and openings 32a are formed in the portions corresponding to the openings 31a in the passivation film 31. Here, as the supporting film 32, resin such as epoxy-based, acryl-based or polyimide-based one can be used. Alternatively, SiO$_2$ formed by plasma-CVD, etc., may be used. Also, the openings 32a in the supporting film 32 can be formed by a photolithography method using, for example, photosensitive resin or by a patterning process such as etching (FIG. 11). In addition, a conductive material 33 made of Cu is deposited in such a manner as to fill the openings 31a and 32a. This can be made through the steps of, for example, depositing a Cu seed layer, etc., by sputtering, etc., on the surface of the anode electrodes 25 and the cathode electrodes 26 that are exposed from the openings 31a and 32a, and depositing Cu, etc., by plating on the Cu seed layer (FIG. 12).

Figure 13:
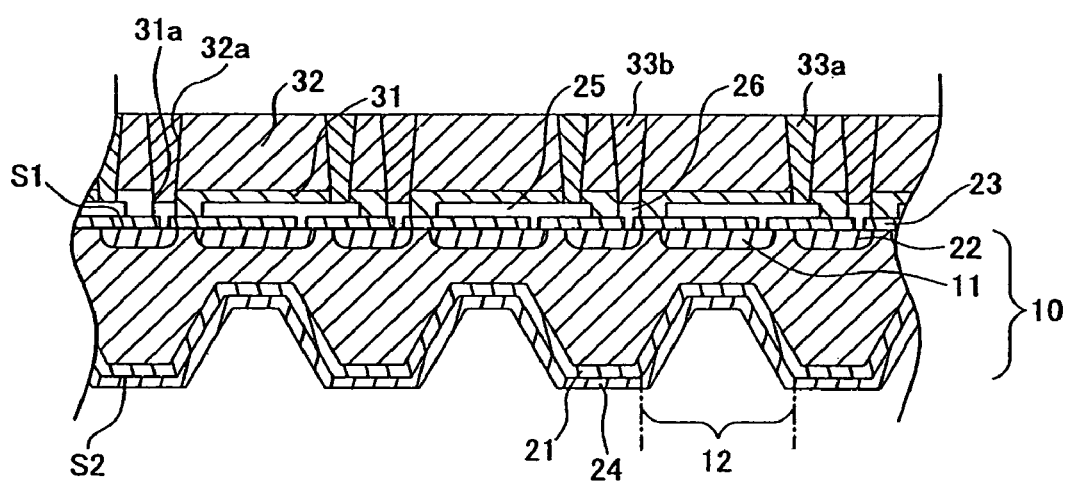
FIG. 13 is a step chart showing a method for manufacturing the back illuminated photodiode 1 shown in FIG. 1.
Figure 14:
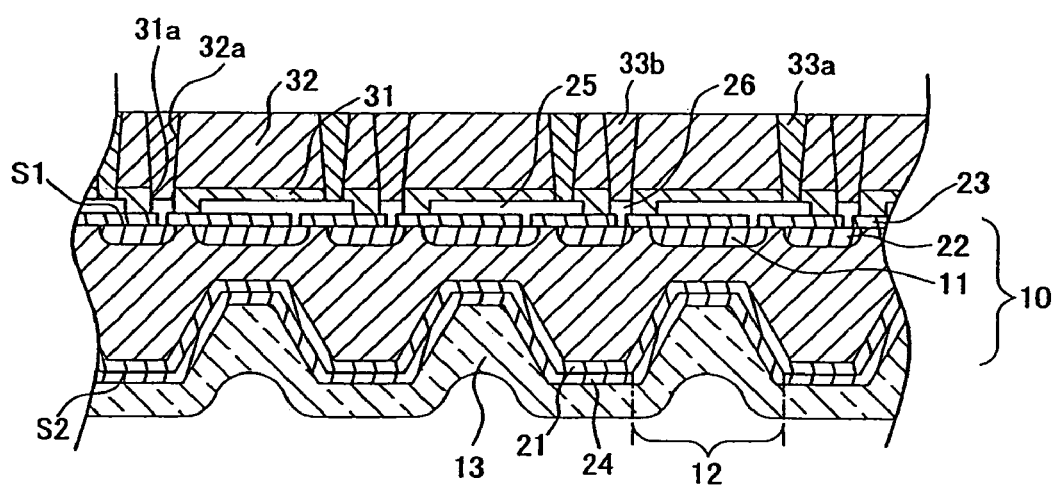
FIG. 14 is a step chart showing a method for manufacturing the back illuminated photodiode 1 shown in FIG. 1.
Figure 15:
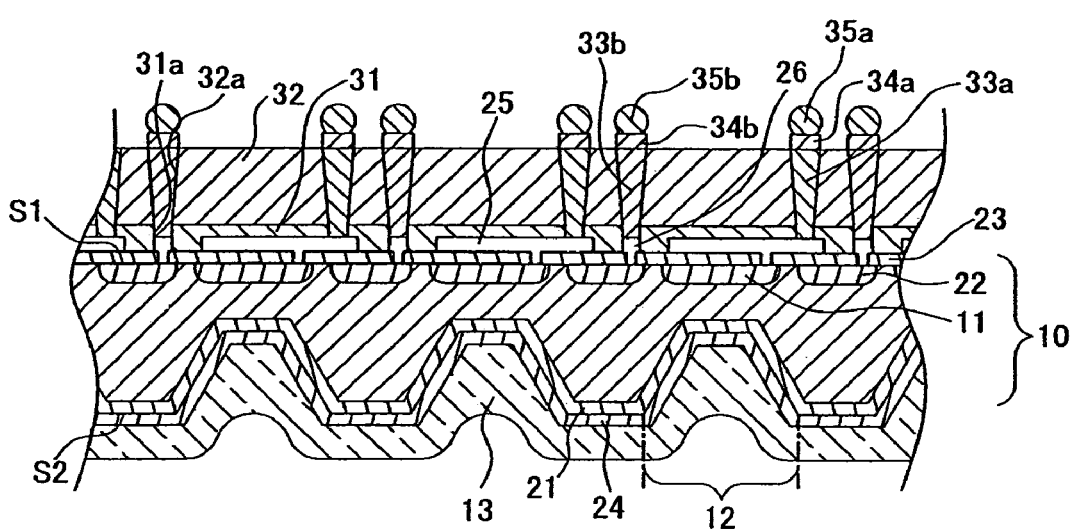
FIG. 15 is a step chart showing a method for manufacturing the back illuminated photodiode 1 shown in FIG. 1.
Figure 16:
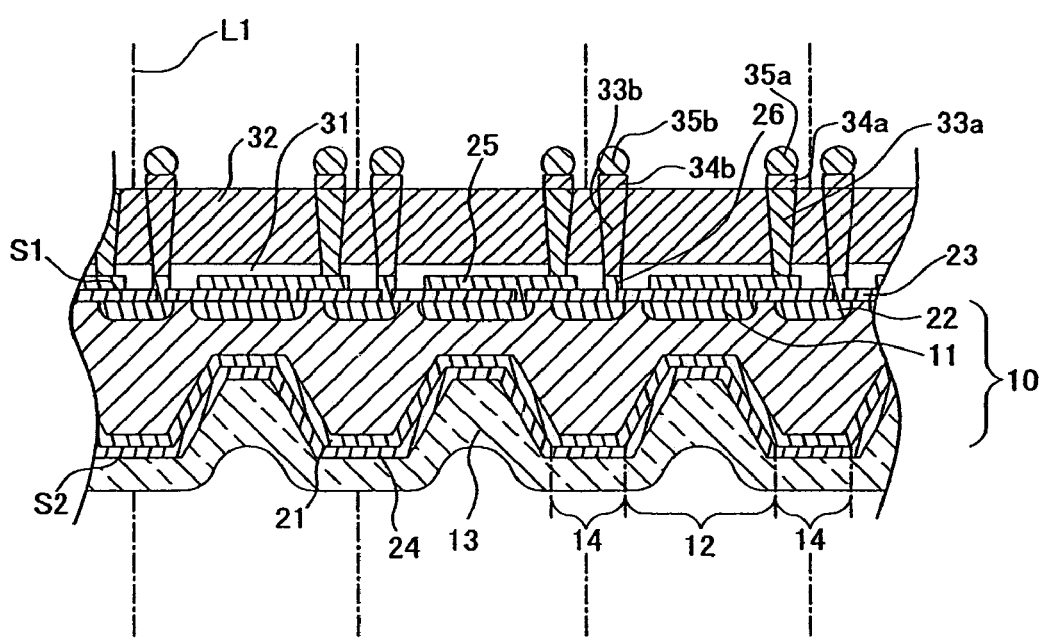
FIG. 16 is a step chart showing a method for manufacturing the back illuminated photodiode 1 shown in FIG. 1.
Figure 17:
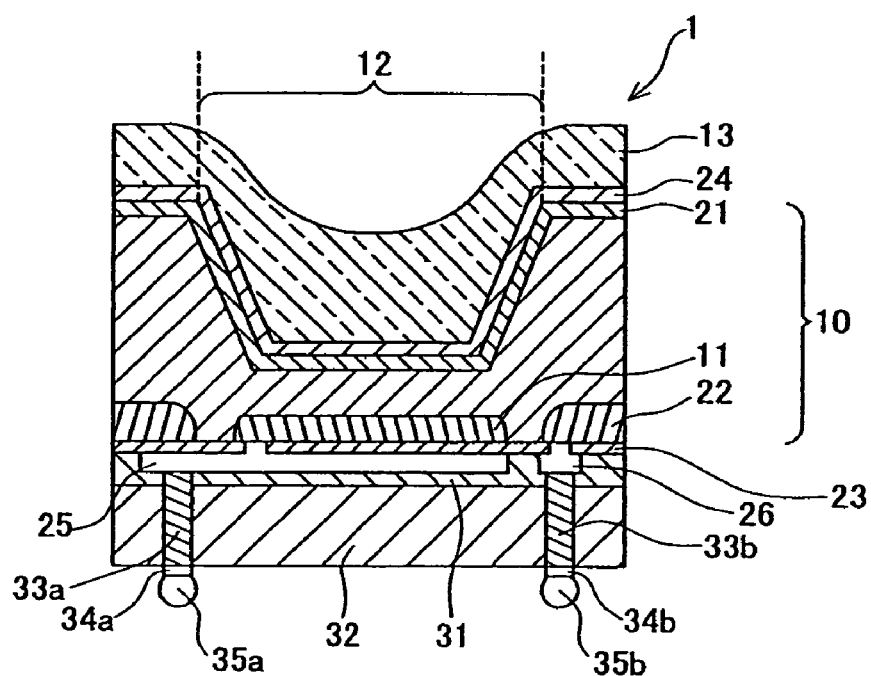
FIG. 17 is a step chart showing a method for manufacturing the back illuminated photodiode 1 shown in FIG. 1.

Next, the surface of the conductive material 33 is polished to remove the conductive material 33 deposited on the supporting film 32. Thus, filling electrodes 33a and 33b are formed (FIG. 13). Also, after a coating layer 13 made of resin is applied by spin coating or printing, etc., in such a manner as to fully cover the rear surface S2, the applied coating layer 13 is hardened. Here, the portion of the coating layer 13 provided on the recessed portion 12 is to be sunk (FIG. 14). Further, UBMs 34a and 34b composed of accumulation films made of Ni and Au, etc., are formed on the filling electrodes 33a and 33b on the upper surface S1 by electroless plating. In addition, bumps 35a and 35b made of solder, etc., are formed on the UBMs 34a and 34b by printing or a ball-mounting method, etc., (FIG. 15).

Finally, in order to obtain individually separated back illuminated photodiodes 1, dicing is performed. As indicated by the alternate long and short dashed lines L1 in FIG. 16, the N-type semiconductor substrate 10 is diced at the center of each outer edge portion 14 on the rear surface S2 side. Thus, a back illuminated photodiode 1 (FIG. 17) is obtained.

Figure 18:
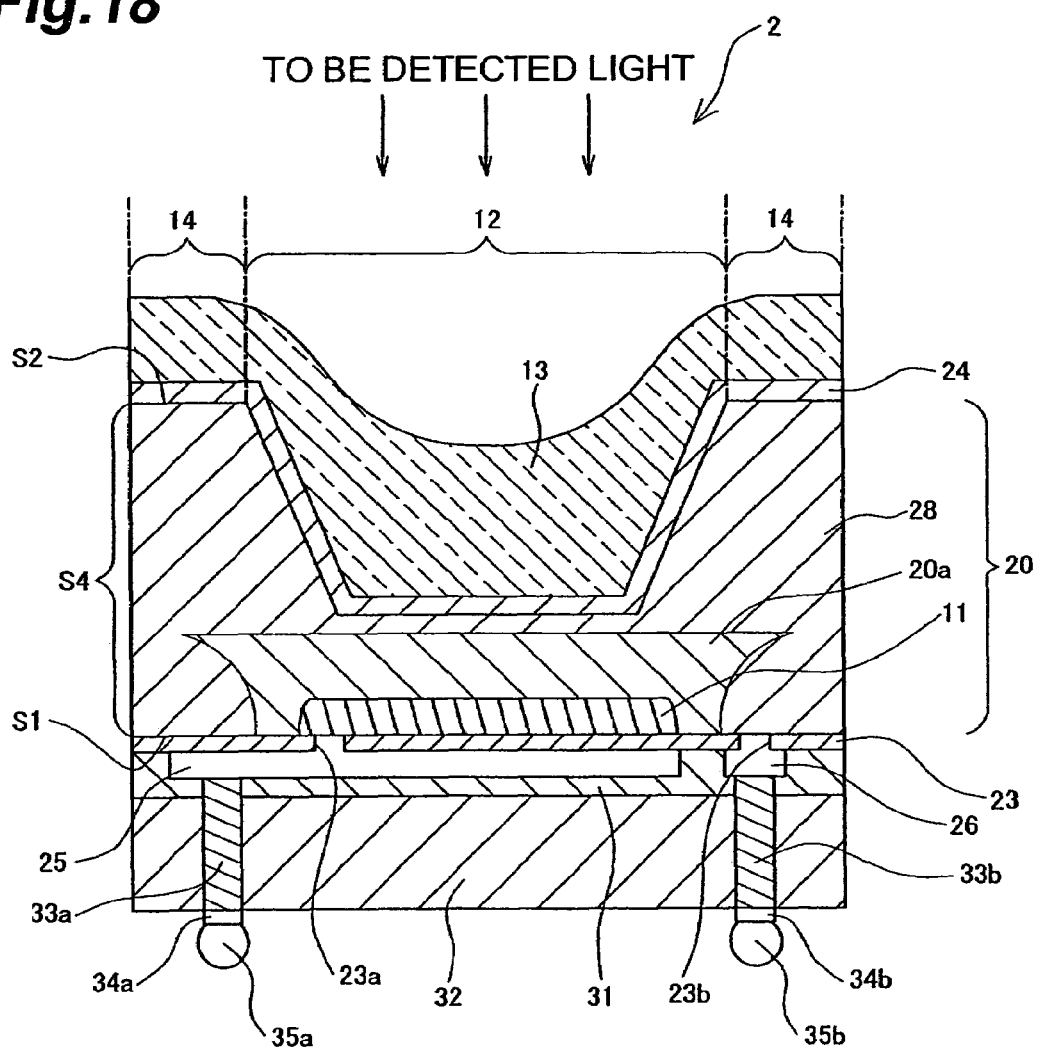
FIG. 18 is a cross-sectional view showing a second embodiment of a back illuminated photodetector according to the present invention.

FIG. 18 is a cross-sectional view showing a second embodiment of a back illuminated photodetector according to the present invention. The back illuminated photodiode 2 comprises a semiconductor substrate 20, a P+-type doped semiconductor region 11, a recessed portion 12, and a coating layer 13.

In the surface layer on the upper surface S1 side of the semiconductor substrate 20 is partially formed the P+-type doped semiconductor region 11. Meanwhile, in the rear surface S2 of the semiconductor substrate 20 and in an area opposite the P+-type doped semiconductor region 11 is formed the recessed portion 12. Also, on the rear surface S2 of the semiconductor substrate 20 is provided the coating layer 13. The coating layer 13 is arranged in such a manner that the portion provided on the recessed portion 12 is sunk lower than the portion provided on the outer edge portion 14 of the recessed portion 12.

The back illuminated photodiode 2 also comprises an N+-type highly-doped semiconductor region 28, insulating films 23 and 24, an anode electrode 25, and a cathode electrode 26. The N+-type highly-doped semiconductor region 28 is formed in such a manner as to be exposed at the entire side surfaces S4 of the semiconductor substrate 20. The N+-type highly-doped semiconductor region 28 also reaches the entire rear surface S2 of the semiconductor substrate 20. Therefore, the portion 20a within the semiconductor substrate 20, in which neither the P+-type doped semiconductor region 11 nor the N+-type highly-doped semiconductor region 28 is formed, is surrounded entirely by the N+-type highly-doped semiconductor region 28 from the side surface S4 sides and the rear surface S2 side of the semiconductor substrate 20.

Figure 19:
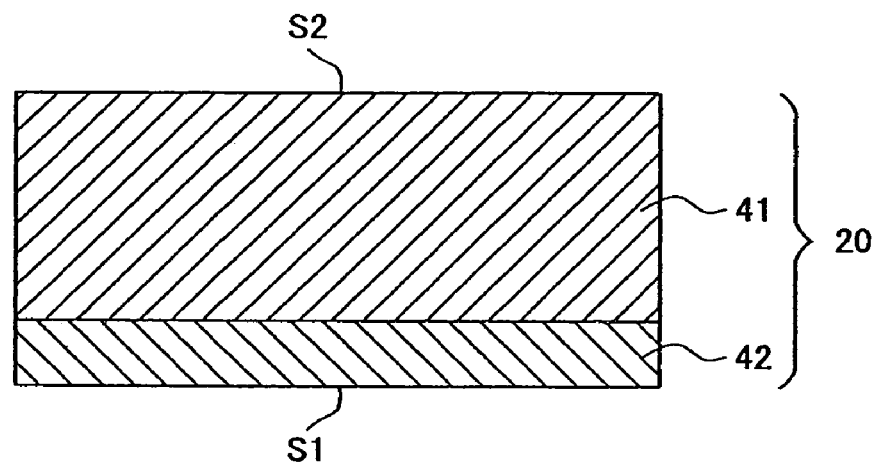
FIG. 19 is a view illustrating an exemplary method for forming the N$^+$-type highly-doped semiconductor region 28 shown in FIG. 18.
Figure 20:
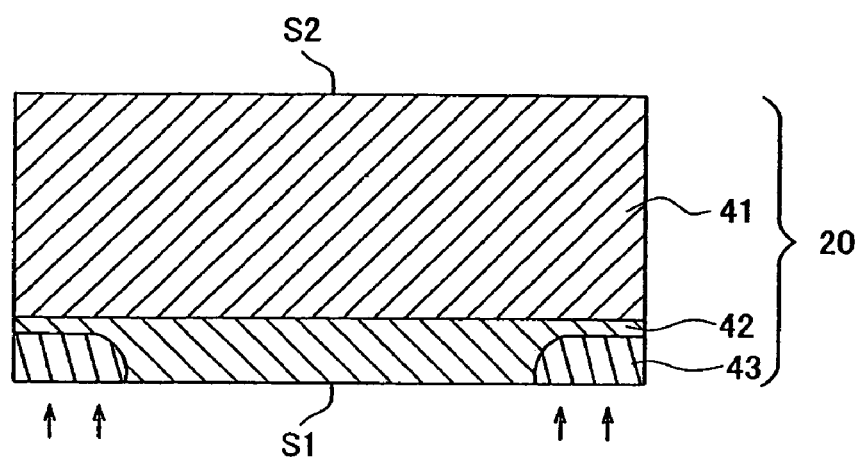
FIG. 20 is a view illustrating an exemplary method for forming the N$^+$-type highly-doped semiconductor region 28 shown in FIG. 18.
Figure 21:
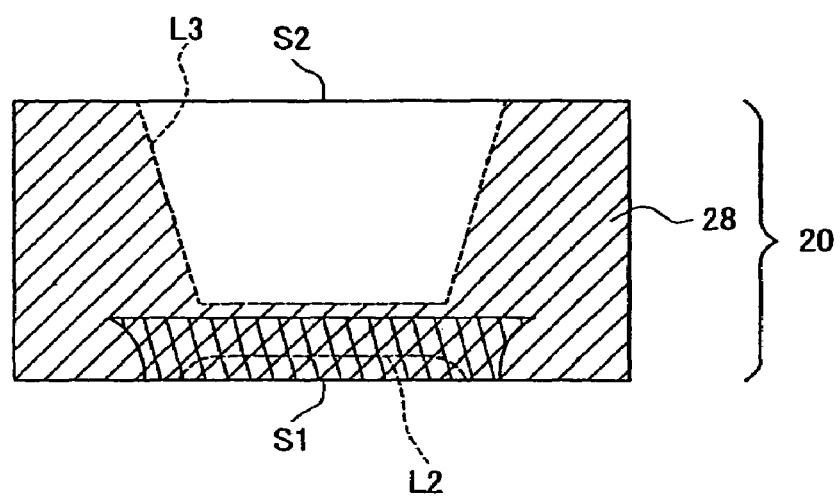
FIG. 21 is a view illustrating an exemplary method for forming the N$^+$-type highly-doped semiconductor region 28 shown in FIG. 18.

An exemplary method for forming the N+-type highly-doped semiconductor region 28 will here be described with reference to FIG. 19 to FIG. 21. First, there is prepared a semiconductor substrate 20. In the semiconductor substrate 20, an N+-type highly-doped semiconductor layer 41 is diffused from the rear surface S2 with a part on the upper surface S1 side remaining. The remaining part on the upper surface S1 side is an N-type doped semiconductor layer 42 having an impurity concentration lower than that of the N+-type highly-doped semiconductor layer 41 (FIG. 19). Next, N-type impurities are doped at a high concentration from the upper surface S1 side to form N+-type highly-doped semiconductor regions 43 (FIG. 20). Then, the N-type impurities are diffused further deeply by heat treatment so that the N+-type highly-doped semiconductor regions 43 reach the N+-type highly-doped semiconductor layer 41 (FIG. 21). There is thus formed an N+-type highly-doped semiconductor region 28 composed of the N+-type highly-doped semiconductor layer 41 and the N+-type highly-doped semiconductor regions 43. Additionally, in FIG. 21, the areas where a P+-type doped semiconductor region 11 and a recessed portion 12 are to be formed are indicated, respectively, by the dashed lines L2 and L3. In accordance with the method, since it is possible to omit the step of doping impurities from the rear surface S2 side of the semiconductor substrate 20, the manufacturing process for the N+-type highly-doped semiconductor region 28 and therefore for the entire back illuminated photodiode 2 is simplified.

Returning to FIG. 18, on the upper surface S1 and the rear surface S2 of the semiconductor substrate 20 are formed, respectively, the insulating films 23 and 24. Also, in the insulating film 23 are formed openings 23a and 23b, one opening 23a being provided within the range of the P+-type doped semiconductor region 11, while the other opening 23b being provided within the range of the N+-type highly-doped semiconductor region 28.

On the insulating film 23 and in the areas including the openings 23a and 23b are formed, respectively, the anode electrode 25 and the cathode electrode 26. The electrodes 25 and 26 are provided in such a manner as to fill the respective openings 23a and 23b. Thus, the anode electrode 25 is connected directly to the P+-type doped semiconductor region 11 through the opening 23a, while the cathode electrode 26 is connected directly to the N+-type highly-doped semiconductor region 28 through the opening 23b.

The back illuminated photodiode 2 further comprises a passivation film 31, a supporting film 32, filling electrodes 33a and 33b, UBMs 34a and 34b, and bumps 35a and 35b. The passivation film 31 is provided on the upper surface S1 of the semiconductor substrate 20 in such a manner as to cover the insulating film 23, anode electrode 25, and cathode electrode 26. On the passivation film 31 is formed the supporting film 32. Also, the filling electrodes 33a and 33b penetrate through the passivation film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 2 will here be described. In the back illuminated photodiode 2, since there is provided the coating layer 13, the mechanical strength of the back illuminated photodiode 2 is increased. Also, the increase in mechanical strength allows for dicing at a wafer level, whereby it is possible to obtain a chip-sized back illuminated photodiode 2. Accordingly, there is achieved a back illuminated photodiode 2 having a sufficiently small package.

Further, the coating layer 13 is arranged in such a manner that the portion provided on the recessed portion 12 is sunk lower than the portion provided on the outer edge portion 14 of the recessed portion 12. Therefore, even if a flat collet may be used in an assembling operation, the surface of the coating layer 13 provided on the recessed portion 12 is not brought into contact with the flat collet. Thus, the incident part for to-be-detected light within the surface of the coating layer 13 cannot be damaged, whereby it is possible to suppress the scattering of to-be-detected light. Thus, a highly sensitive back illuminated photodiode 2 is achieved.

Also, in the back illuminated photodiode 2, the N+-type highly-doped semiconductor region 28 is formed in such a manner as to be exposed at the entire side surfaces S4 of the semiconductor substrate 20. Thus, the N+-type highly-doped semiconductor region 28 can trap unnecessary carriers that are generated in the vicinity of the side surfaces S4 of the semiconductor substrate 20 and thereby can suppress dark current and/or noise. Although the side surfaces S4 correspond to dicing lines whereby there is a possibility of causing crystal defects in dicing, the N+-type highly-doped semiconductor region 28 can also suppress dark current and/or noise due to the crystal defects. Therefore, in accordance with the back illuminated photodiode 2, it is possible to obtain a detected signal at a higher S/N ratio.

In addition, the portion 20a within the semiconductor substrate 20 is surrounded entirely by the N+-type highly-doped semiconductor region 28 from the side surface S4 sides and the rear surface S2 side of the semiconductor substrate 20. Thus, a PIN structure in which the surrounded portion 20a is employed as an I-layer is achieved. The back illuminated photodiode 2 can be provided with a higher voltage and thereby can increase the width of the depletion layer due to such a PIN structure, which can increase the sensitivity as well as reduce the capacity thereof to achieve a high-speed response.

Figure 22:
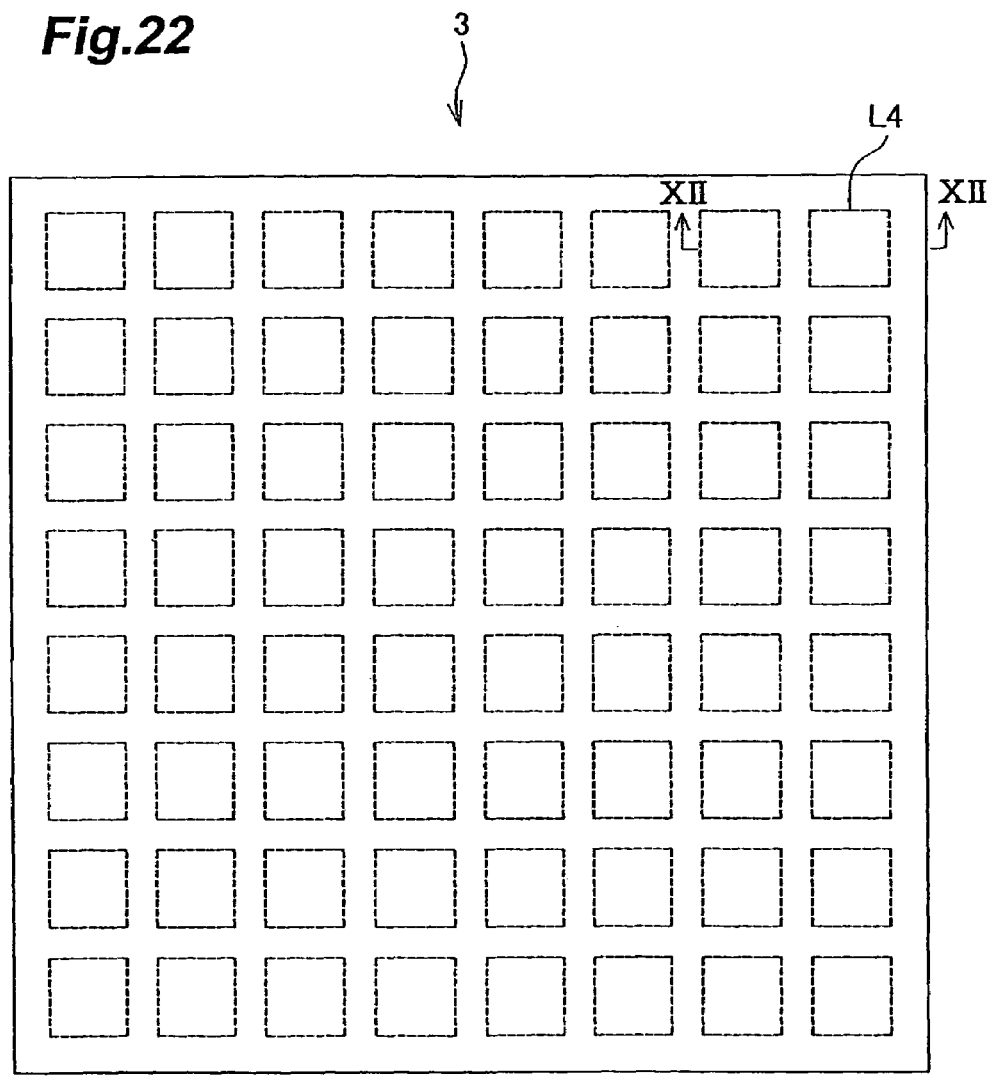
FIG. 22 is a plan view showing a third embodiment of a back illuminated photodetector according to the present invention.

FIG. 22 is a plan view showing a third embodiment of a back illuminated photodetector according to the present invention. The back illuminated photodiode array 3 is composed of a total of sixty-four back illuminated photodiodes that are arranged in an eight-by-eight grid pattern. The arrangement pitch of these photodiodes is 1 mm, for example. FIG. 22 shows the appearance of the back illuminated photodiode array 3 when viewed from the rear surface side. The rear surface of each photodiode is covered with a coating layer, and is formed in such a manner that predetermined portions of the coating layer are sunk, as is the case with the back illuminated photodiode 1 shown in FIG. 1. In FIG. 22, the sunk portions of the coating layer are indicated by the dashed lines L4.

Figure 23:
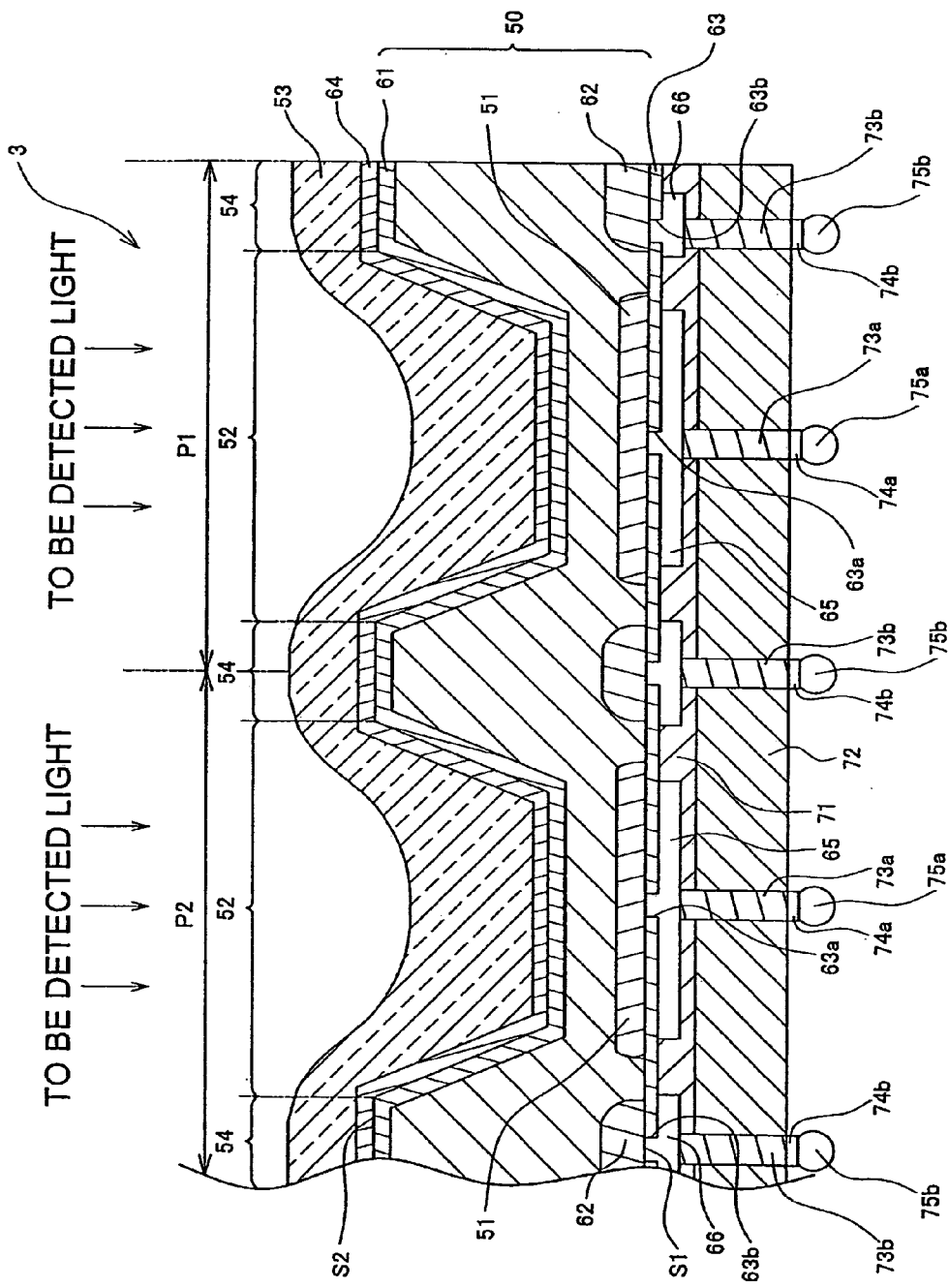
FIG. 23 is a cross-sectional view of the back illuminated photodiode array 3 shown in FIG. 22 along the line XII-XII.
Figure 24:
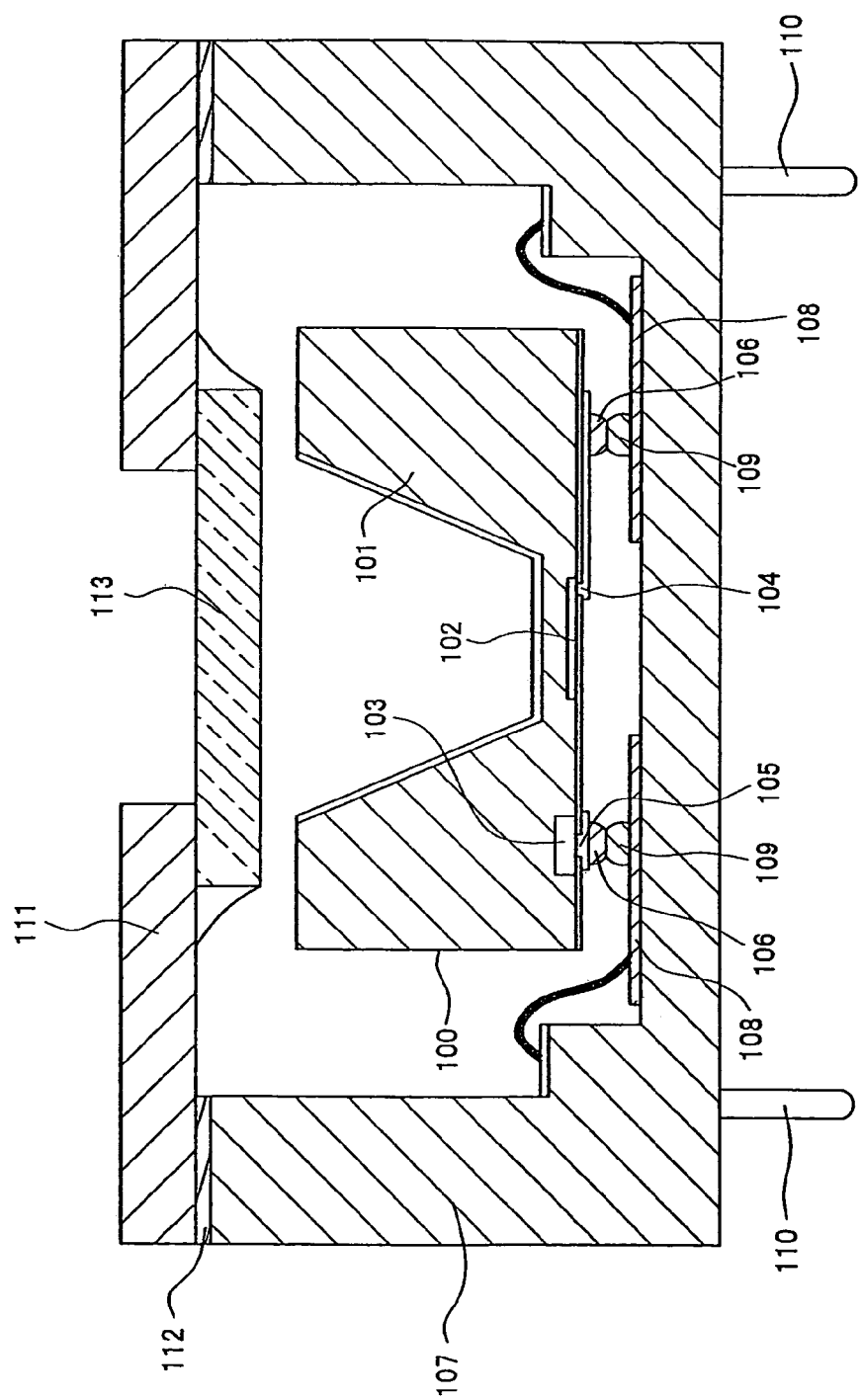
FIG. 24 is a cross-sectional view of a conventional back illuminated photodiode.

FIG. 23 is a cross-sectional view of the back illuminated photodiode array 3 shown in FIG. 22 along the line XII-XII. In the cross-sectional view are shown two photodiodes P1 and P2 among the sixty-four photodiodes shown in FIG. 22. As shown in FIG. 23, the back illuminated photodiode array 3 comprises an N-type semiconductor substrate 50, a P+-type doped semiconductor region 51, a recessed portion 52, and a coating layer 53.

In the surface layer on the upper surface S1 side of the N-type semiconductor substrate 50 are formed a plurality of the P+-type doped semiconductor regions 51. The P+-type doped semiconductor regions 51 are provided, respectively, for the photodiodes P1 and P2. The area of each P+-type doped semiconductor region 51 is 0.75×0.75 mm², for example. In the rear surface S2 of the N-type semiconductor substrate 50 and in an area opposite the P+-type doped semiconductor region 51 is formed the recessed portion 52. Here is formed a plurality of the recessed portions 52 being provided with a plurality of the P+-type doped semiconductor regions 51. In each of the photodiodes P1 and P2 are provided a pair of a P+-type doped semiconductor region 51 and a recessed portion 52. Also, on the rear surface S2 of the N-type semiconductor substrate 50 is provided the coating layer 53. The coating layer 53 is arranged in such a manner that the portion provided on the recessed portion 52 is sunk lower than the portion provided on the outer edge portion 54 of the recessed portion 52.

The back illuminated photodiode array 3 also comprises an N+-type highly-doped semiconductor layer 61, N+-type highly-doped semiconductor regions 62, insulating films 63 and 64, anode electrodes 65, and cathode electrodes 66. The N+-type highly-doped semiconductor layer 61 is formed in the entire surface layer on the rear surface S2 side of the N-type semiconductor substrate 50. The N+-type highly-doped semiconductor regions 62 are formed in the surface layer on the upper surface S1 side of the N-type semiconductor substrate 50. The N+-type highly-doped semiconductor regions 62 are preferably provided in such a manner as to surround the P+-type doped semiconductor regions 51 constituting the respective photodiodes.

On the upper surface S1 and the rear surface S2 of the N-type semiconductor substrate 50 are formed, respectively, the insulating films 63 and 64. In the insulating film 63 are formed openings 63a and 63b, some openings 63a being provided within the range of the P+-type doped semiconductor regions 51, while the other openings 63b being provided within the range of the N+-type highly-doped semiconductor regions 62.

On the insulating film 63 and in the areas including the openings 63a and 63b are formed, respectively, the anode electrodes 65 and the cathode electrodes 66. In each of the photodiodes P1 and P2 are provided a pair of an anode electrode 65 and a cathode electrode 66. The electrodes 65 and 66 are also provided in such a manner as to fill the respective openings 63a and 63b. Thus, the anode electrodes 65 are connected directly to the P+-type doped semiconductor regions 51 through the respective openings 63a, while the cathode electrodes 66 are connected directly to the N+-type highly-doped semiconductor regions 62 through the respective openings 63b.

The back illuminated photodiode array 3 further comprises a passivation film 71, a supporting film 72, filling electrodes 73a and 73b, UBMs 74a and 74b, and bumps 75a and 75b. The passivation film 71 is provided on the upper surface S1 of the N-type semiconductor substrate 50 in such a manner as to cover the insulating film 63, anode electrodes 65, and cathode electrodes 66. On the passivation film 71 is formed the supporting film 72. Also, the filling electrodes 73a and 73b penetrate through the passivation film 71 and the supporting film 72 to extend, respectively, from the anode electrodes 65 and the cathode electrodes 66 to the surface of the supporting film 72. On the exposed portions of the filling electrodes 73a and 73b at the surface of the supporting film 72 are formed the UBMs 74a and 74b. On the surfaces of the UBMs 74a and 74b on the opposite side of the filling electrodes 73a and 73b are formed the bumps 75a and 75b.

The effect of the back illuminated photodiode array 3 will here be described. In the back illuminated photodiode array 3, since there is provided the coating layer 53, the mechanical strength of the back illuminated photodiode array 3 is increased. Also, the increase in mechanical strength allows for dicing at a wafer level, whereby it is possible to obtain a chip-sized back illuminated photodiode array 3. Accordingly, there is achieved a back illuminated photodiode array 3 having a sufficiently small package.

Further, the coating layer 53 is arranged in such a manner that the portions provided on the recessed portions 52 are sunk lower than the portions provided on the outer edge portions 54 of the recessed portions 52. Therefore, even if a flat collet may be used in an assembling operation, the surface of the coating layer 53 provided on the recessed portions 52 is not brought into contact with the flat collet. Thus, the incident parts for to-be-detected light within the surface of the coating layer 53 cannot be damaged, whereby it is possible to suppress the scattering of to-be-detected light. Thus, a highly sensitive back illuminated photodiode array 3 is achieved.

There are also constructed a plurality of photodiodes by forming a plurality of P+-type doped semiconductor regions 51 in a plurality of areas in the surface layer on the upper surface S1 side of the N-type semiconductor substrate 50, and by forming recessed portions 52 in the rear surface S2 and in areas opposite the respective P+-type doped semiconductor regions 51. Therefore, the back illuminated photodiode array 3 can suitably be used for an image sensor, etc., in which each photodiode represents one pixel.

The back illuminated photodetector according to the present invention is not restricted to the above-described embodiments, and various modifications may be made. For example, in the back illuminated photodiode 1 shown in FIG. 1, a P-type semiconductor substrate may be used instead of the N-type semiconductor substrate 10. In this case, the doped semiconductor region 11 has N-type conductivity, while the highly-doped semiconductor layer 21 and the highly-doped semiconductor region 22 have P-type conductivity.

Although in FIG. 12 is shown an example of depositing a conductive material 33 made of Cu, Ni may be used instead of Cu to perform electroless plating of Ni directly on the surface of the anode electrodes 25 and the cathode electrodes 26 that are exposed from the openings 31a and 32a. In this case, it is possible to omit the step of polishing the surface of the conductive material 33 illustrated in FIG. 13.

Although in FIG. 15 an example of forming UBMs 34a and 34b as well as bumps 35a and 35b on the filling electrodes 33a and 33b is shown, there is also a method of employing the filling electrodes 33a and 33b themselves as bumps. That is, $O_2$, etc., is used to dry etch the surface of the supporting film 32 with the openings 32a being filled with the filling electrodes 33a and 33b (refer to FIG. 14). Thus, since the filling electrodes 33a and 33b partially protrude from the surface of the supporting film 32, the protruding portions can be used as bumps. In this case, it is also not necessary to form UBMs 34a and 34b. Alternatively, as a conductive material 33, a conductive resin may be used. This allows the operation of filling the through holes with electrodes by printing, etc., to be completed in a short time.

Also, in FIG. 19, as the semiconductor substrate 20, a bonded wafer in which an N+-type highly-doped semiconductor layer and an N-type doped semiconductor layer having an impurity concentration lower than that of the N+-type highly-doped semiconductor layer are bonded to each other may be used. In this case, the N-type doped semiconductor layer is to be provided on the upper surface S1 side, while the N+-type highly-doped semiconductor layer on the rear surface S2 side of the semiconductor substrate 20.

INDUSTRIAL APPLICABILITY

In accordance with the present invention, it is possible to achieve a back illuminated photodetector having a sufficiently small package as well as being capable of suppressing the scattering of to-be-detected light.

The invention claimed is:

1. A back illuminated photodetector comprising:
a first conductivity type semiconductor substrate;
a second conductivity type doped semiconductor region provided in a first superficial surface layer of the semiconductor substrate;
a recessed portion for incidence of to-be-detected light formed in the second surface of the semiconductor substrate and in an area opposite the doped semiconductor region; and
a coating layer made of resin for transmitting the to-be-detected light, the coating layer being provided on the second surface,
the coating layer being arranged in such a manner that the portion provided on the recessed portion in the second surface is sunk lower than the portion provided on the outer edge portion of the recessed portion; and
wherein a highly-doped semiconductor region with impurities of the first conductivity type added thereto at a high concentration is exposed across the entire side surface of the semiconductor substrate.

2. The back illuminated photodetector according to claim 1, further comprising a supporting film provided on the first surface of the semiconductor substrate to support the semiconductor substrate.

3. The back illuminated photodetector according to claim 2, further comprising a filling electrode penetrating through the supporting film and connected electrically to the doped semiconductor region at one end thereof.

4. A back illuminated photodetector comprising:
a first conductivity type semiconductor substrate;
a second conductivity type doped semiconductor region provided in a first superficial surface layer of the semiconductor substrate;
a recessed portion for incidence of to-be-detected light formed in the second surface of the semiconductor substrate and in an area opposite the doped semiconductor region; and
a coating layer made of resin for transmitting the to-be-detected light, the coating layer being provided on the second surface,
the coating layer being arranged in such a manner that the portion provided on the recessed portion in the second surface is sunk lower than the portion provided on the outer edge portion of the recessed portion; and
wherein a highly-doped semiconductor layer with impurities of the first conductivity type added thereto at a high concentration is provided in the bottom portion of the recessed portion within a second superficial surface layer of the semiconductor substrate.

5. The back illuminated photodetector according to claim 4, further comprising a supporting film provided on the first surface of the semiconductor substrate to support the semiconductor substrate.

6. The back illuminated photodetector according to claim 5, further comprising a filling electrode penetrating through the supporting film and connected electrically to the doped semiconductor region at one end thereof.

7. A back illuminated photodetector comprising:
a first conductivity type semiconductor substrate;
a second conductivity type doped semiconductor region provided in a first superficial surface layer of the semiconductor substrate;
a recessed portion for incidence of to-be-detected light formed in the second surface of the semiconductor substrate and in an area opposite the doped semiconductor region; and
a coating layer made of resin for transmitting the to-be-detected light, the coating layer being provided on the second surface,
the coating layer being arranged in such a manner that the portion provided on the recessed portion in the second surface is sunk lower than the portion provided on the outer edge portion of the recessed portion; and
wherein a highly-doped semiconductor layer with impurities of the first conductivity type added thereto at a high concentration is provided in a second superficial surface layer in the outer edge portion of the semiconductor substrate.

8. The back illuminated photodetector according to claim 7, further comprising a supporting film provided on the first surface of the semiconductor substrate to support the semiconductor substrate.

9. The back illuminated photodetector according to claim 8, further comprising a filling electrode penetrating through the supporting film and connected electrically to the doped semiconductor region at one end thereof.

* * * * *